(12) United States Patent
Satoh et al.

(10) Patent No.: US 8,594,565 B2
(45) Date of Patent: Nov. 26, 2013

(54) WIRELESS COMMUNICATION APPARATUS AND WIRELESS COMMUNICATION METHOD

(75) Inventors: Yoshinori Satoh, Saitama (JP); Takashi Tsurumoto, Saitama (JP); Masahiro Nakano, Tokyo (JP); Kazunori Kikuchi, Kanagawa (JP)

(73) Assignee: Sony Corporation (JP)

( * ) Notice: Subject to any disclaimer, the term of this patent is extended or adjusted under 35 U.S.C. 154(b) by 232 days.

(21) Appl. No.: 13/128,277

(22) PCT Filed: Nov. 13, 2009

(86) PCT No.: PCT/JP2009/069670
§ 371 (c)(1),
(2), (4) Date: May 9, 2011

(87) PCT Pub. No.: WO2010/058827
PCT Pub. Date: May 27, 2010

(65) Prior Publication Data
US 2011/0223862 A1    Sep. 15, 2011

(30) Foreign Application Priority Data
Nov. 20, 2008 (JP) .............................. P2008-296534

(51) Int. Cl.
*H04B 5/00* (2006.01)
*H04B 7/00* (2006.01)
*G06F 3/041* (2006.01)

(52) U.S. Cl.
USPC .......................... 455/41.1; 455/41.3; 345/173

(58) Field of Classification Search
USPC ............. 455/41.1–41.3, 67.11; 345/643, 419, 345/634, 672, 676, 633, 173
See application file for complete search history.

(56) References Cited

U.S. PATENT DOCUMENTS 6,167,142 A * 12/2000 Nozaki .................. 382/103
7,812,841 B2 * 10/2010 Kamiwada et al. ........... 345/474
8,219,028 B1 * 7/2012 Flamholz ..................... 455/41.2

(Continued)

FOREIGN PATENT DOCUMENTS

| JP | 2007-104523 A | 4/2007 |
| JP | 2007-251637 A | 9/2007 |
| JP | 2008-131532 A | 6/2008 |
| JP | 2008-228189 A | 9/2008 |

OTHER PUBLICATIONS

Supplementary European Search Report EP 09827608, dated May 7, 2012.

*Primary Examiner* — Andrew Wendell
*Assistant Examiner* — Cindy Trandai
(74) *Attorney, Agent, or Firm* — Lerner, David, Littenberg, Krumholz & Mentlik, LLP

(57) ABSTRACT

The risk of a third party able to conduct pairing is reduced, and operation is also made simple. In S1 the radio wave strength of a pairing signal received first is measured and retained. In S2 the message "Come a little closer" is displayed. In S4 it is determined from the radio wave strength whether or not the current distance is within a given range with respect to an instructed distance. In S5 it is determined whether or not the number of determinations in which the current distance is determined to be within the given range has reached a set number of determinations. In a second determination the message "Now move away a little" is displayed. If the second determination becomes positive, S6 (pairing registration) is performed.

7 Claims, 6 Drawing Sheets

(56) References Cited

U.S. PATENT DOCUMENTS

| | | | |
|---|---|---|---|
| 8,237,563 B2 * | 8/2012 | Schatz et al. | 340/572.1 |
| 8,319,900 B2 * | 11/2012 | Candelore et al. | 348/734 |
| 8,446,254 B2 * | 5/2013 | Carrick et al. | 340/10.1 |
| 2003/0220795 A1 | 11/2003 | Arayasantiparb et al. | |
| 2006/0160540 A1 * | 7/2006 | Strutt et al. | 455/440 |
| 2007/0080939 A1 | 4/2007 | Isozu | |
| 2008/0157993 A1 | 7/2008 | Du Breuil et al. | |
| 2008/0198034 A1 | 8/2008 | Nakano | |

* cited by examiner

WIRELESS COMMUNICATION APPARATUS AND WIRELESS COMMUNICATION METHOD

CROSS-REFERENCES TO RELATED APPLICATIONS

The present application is a national phase entry under 35 U.S.C. §371 of International Application No. PCT/JP2009/069670 filed Nov. 13, 2009, published on May 27, 2010 as WO 2010/058827 A1, which claims priority from Japanese Patent Application No. JP 2008-296534 filed in the Japanese Patent Office on Nov. 20, 2008.

TECHNICAL FIELD

The present invention relates to a wireless communication apparatus and a wireless communication method applied to remote control of an electronic device by a wireless communication protocol, for example.

BACKGROUND ART

If wireless communication is used to remotely control an electronic device such as a television receiver, the 2.4 GHz band ISM (Industrial, Scientific, and Medical use) band has advantages in that the influence of shield objects becomes smaller compared to infrared protocols, and additionally, the reach distance is extended. Furthermore, since the receiving side returns an acknowledgement and retransmission is conducted even if communication fails, there is an advantage in that operations are reliably transmitted.

In a remote control system according to such wireless communication (hereinafter abbreviated to RF as appropriate), there is a problem of unintentionally controlling devices installed in an adjacent room or adjacent home. For this reason, when newly purchasing and installing a television receiver, a one-to-one association (referred to as pairing) is necessary in order to enable control of the television receiver by a commander (referred to as a remote controller where appropriate). Pairing means exchanging mutual IDs (identification information) between a remote controller and an electronic device to be controlled.

In commercially available wireless LAN devices, pairing may be made by directly inputting an ID. With this method, input operations are troublesome in the case of devices widely used in homes, such as television receivers. If the number of digits in an ID is reduced, the probability that a third party will be able to conduct pairing increases. Since a keypad is necessary to input an ID, there is a problem in that realization is difficult in the case of devices not having a keypad, such as wireless headphones.

In order to simplify operations for pairing, there are configurations that enable pairing by turning the power of a remote controller ON (setting the battery or batteries) within a given amount of time since turning the power of a television device ON. With this method, a third party may conduct pairing with that television receiver by conducting a similar operation. As a result, there occurs risk that personal information for television shopping or the like and secure information such as credit card security codes may be stolen.

As another pairing method, there is also a method wherein a purchased television receiver enters an operational state for conducting pairing (pairing mode) only in the case of first turning the power ON, and pairing mode ends when pairing succeeds. With this method, only a single commander can be paired to a single television receiver. However, there occur concerns that if pairing is conducted by a third party, the original user will become unable to conduct pairing.

Furthermore, as disclosed in Japanese Unexamined Patent Application Publication No. 2007-251637 and Japanese Unexamined Patent Application Publication No. 2008-131532, it is proposed that the electric field strength received by a television receiver be compared to a threshold value, and only a commander whose strength is equal to or greater than the threshold value be taken as a pairing target.

DISCLOSURE OF INVENTION

Technical Problem

A method that takes only a commander existing nearby as a pairing target based on the strength of a radio wave from the commander in this way had a problem in that there are fluctuations in radio wave strength, and pairing cannot be favorably conducted. In other words, there exist fluctuations in the performance of transmitter and receiver devices themselves, fluctuations due to implementation conditions, and fluctuations due to differences in usage environments. It was difficult to suitably set a threshold value for comparison with radio wave strength. If a threshold value is set to a high value in consideration of the influence of fluctuations, there occurs a problem in that pairing cannot be conducted unless a commander is brought extremely close to a television receiver. In contrast, if a threshold value is set to a low value, there occurs a problem in that a third party using a commander that emits high-strength radio waves may conduct pairing with a television receiver.

Consequently, it is an object of the present invention to provide an RF-type wireless communication apparatus and a wireless communication method able to resolve these problems.

Technical Solution

In order to resolve the foregoing problems, the present invention is a wireless communication apparatus including:
displaying means for displaying motion instructions;
radio wave strength measuring means for measuring the radio wave strength of a signal from another wireless communication apparatus; and
arithmetic determining means for computing one of a relative distance to the other wireless communication apparatus and a relative movement amount of the other wireless communication apparatus using the radio wave strength measured by the radio wave strength measuring means, and determining whether or not one of the relative distance and the relative movement amount approximately matches the motion instructions;
wherein a pairing process with the other wireless communication apparatus is conducted in the case where it is determined by the arithmetic determining means that one of the relative distance and the relative movement amount approximately matches the motion instructions.

The radio wave strength first measured by the radio wave strength measuring means is retained as an initial measurement value, and a later measurement value is converted into a relative value based on the initial measurement value by the arithmetic determining means.

One of the relative distance and the relative movement amount, and a number of determinations are included in the motion instructions, and the pairing process is conducted if the number of times in which it is determined by the arithmetic determining means that one of the relative distance and the relative movement amount approximately matches the motion instructions reaches the number of determinations. In this case, the one of the relative distance and the relative movement amount is changed every determination.

One of the relative distance and the relative movement amount, and the presence or absence of a given key operation are included in the motion instructions, and the pairing process is conducted if it is determined by the arithmetic determining means that one of the relative distance and the relative movement amount approximately matches the motion instructions, and if it is detected that the given key was pressed.

The present invention is a wireless communication method including a step of displaying motion instructions by a display unit; and an arithmetic determining step of computing one of a relative distance to another wireless communication apparatus and a relative movement amount of the other wireless communication apparatus using the radio wave strength measured by a radio wave strength measurement unit, and determining whether or not one of the relative distance and the relative movement amount approximately matches the motion instructions;

wherein a pairing process with the other wireless communication apparatus is conducted in the case where it is determined by the arithmetic determining step that one of the relative distance and the relative movement amount approximately matches the motion instructions.

Advantageous Effects

According to the present invention, pairing can be conducted with only a wireless communication apparatus that moves in accordance with displayed motion instructions. Consequently, a third party can be prevented from conducting pairing. Furthermore, there are advantages in that the user operations are simple and do not impose a burden on the user.

MODES FOR CARRYING OUT THE INVENTION

Hereinafter, best modes for carrying out the present invention (hereinafter referred to as embodiments) will be described. Herein, the description will be conducted in the following order.

1. First embodiment
2. Second embodiment
3. Modifications

Furthermore, embodiments described hereinafter are ideal specific examples of the present invention, and although various technically preferable limitations are imposed, the scope of the present invention is not to be limited to these embodiments unless particular statements to the effect of limiting the present invention are given in the description hereinafter.

<1. First Embodiment>

[Exemplary Transmitting Apparatus and Receiving Apparatus]

Figure 1A:
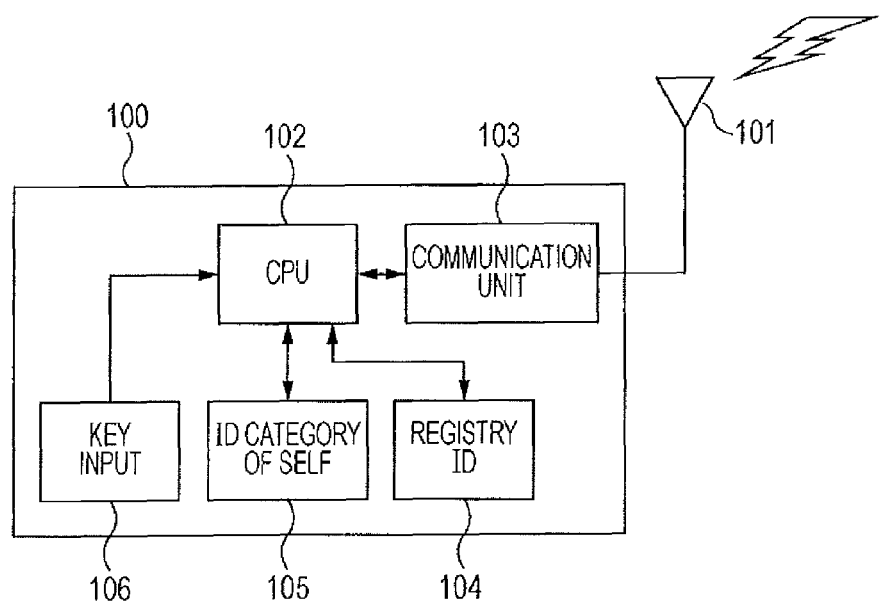
FIG. 1 is a block diagram illustrating respective configurations of an RF-type remote controller and a reception module.

A first embodiment of the present invention is an application of the present invention to an RF-type remote control system for controlling an electronic device such as a television receiver, for example. As illustrated in FIG. 1A, a remote controller 100 includes an antenna 101 for transmitting and receiving wireless radio waves. Additionally, the remote controller 100 includes a microprocessor (hereinafter referred to as a CPU (Central Processing Unit)) 102 as a control unit that causes communication functions, storage medium reading and writing operations, and programs corresponding to various key input to operate.

A remote control signal is transmitted from a communication unit 103 for wireless communication via the antenna 101. Identification information ID of a pairing partner is stored in a storage medium 104. The ID of the remote controller 100 itself and a category code of the electronic device that the remote controller 100 first takes as a pairing target are stored in a storage medium 105. A key input unit 106 including keys is provided.

The storage media 104 and 105 are configured using writable non-volatile memory, for example. The CPU 102 includes ROM (Read Only Memory), RAM (Random Access Memory), etc., and executes overall control of the respective units of the remote controller 100 by implementing programs stored in the ROM.

Figure 1B:
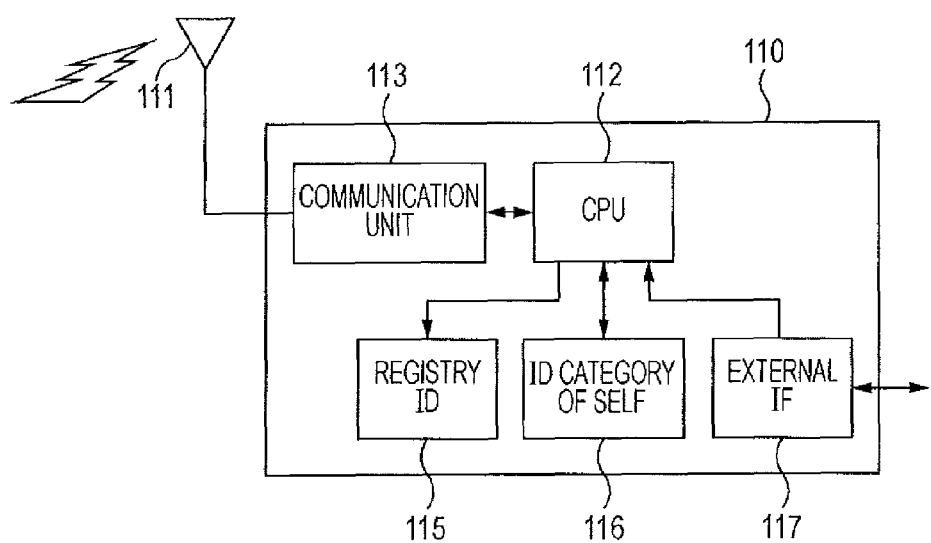

As illustrated in FIG. 1B, a reception module 110 provided in an electronic device includes an antenna 111 for transmitting and receiving wireless radio waves. The reception module 110 includes a CPU 112 that causes communication functions, storage medium reading and writing operations, and programs corresponding to various key input to operate, and a communication unit 113 for wireless communication.

The ID and category code (a code indicating a television receiver category, for example) of the reception module 110 itself are stored in a storage medium 116. An external interface 117 with a television receiver, for example, may be included in the reception module 110. The CPU 112 executes overall control of the respective units of the reception module 110. The storage media 115 and 116 are configured using non-volatile memory, for example.

The communication unit 103 of the remote controller 100 and the communication unit 113 of the reception module 110 conduct bidirectional communication with a given wireless communication protocol. IEEE (Institute of Electrical and Electronics Engineers) 802.15.4, for example, can be used as the communication protocol. IEEE 802.15.4 is the title of a short-range wireless network standard called PAN (Personal Area Network) or W(Wireless)PAN. Herein, the external interface 117 is made to have functions for outputting commands received with respect to an electronic device such as a television receiver, for example, connected thereto.

The communication rate of this standard is several 10 k to several 100 k bps, and the communication range is several 10 m to several 100 m. Also, communication is conducted in units of frames. One frame has a payload (0 to 127 bytes) with a header (6 bytes), for a maximum size of 133 bytes. With this communication protocol, a plurality of modes are possible as the transmission and reception method. In the case of a remote control system, the simplest method is adopted. In other words, a command is transmitted from the remote controller 100 to the reception module 110, and a reply from the reception module 110 is received by the remote controller 100. However, more complicated transmission and reception methods can be used.

[Configuration for Pairing in the First Embodiment]

Figure 2:
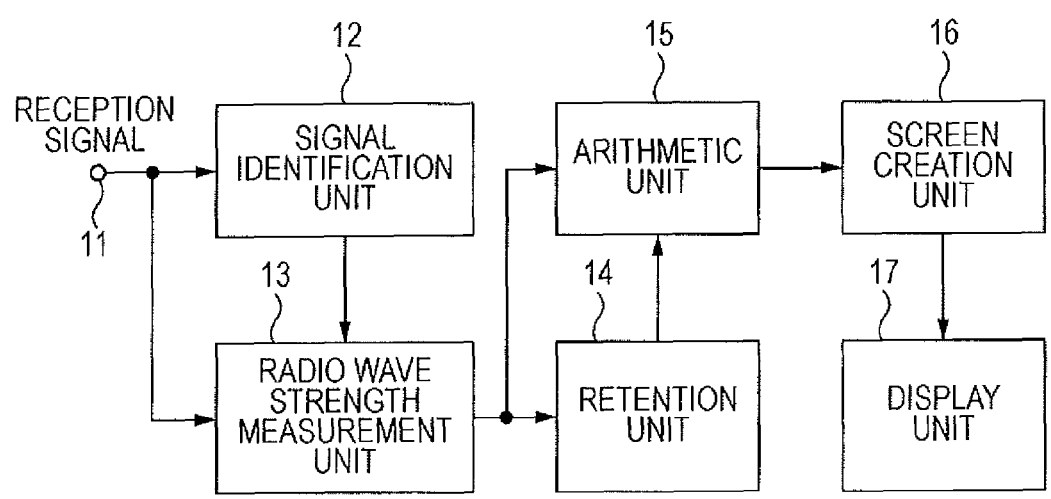
FIG. 2 is a block diagram illustrating a configuration for conducting a pairing process in a first embodiment of the present invention.

The operations respectively conducted by the remote controller 100 and the reception module 110 to store each other's registry IDs are pairing operations. An example of a configuration for pairing provided in a reception module 110 of a receiving side electronic device such as a television receiver, for example, will be described with reference to FIG. 2.

A transmission signal from a remote controller is received, and although not illustrated, is subjected to processes such as amplification, frequency conversion, and demodulation, and is supplied to an input terminal 11. The reception signal supplied to the input terminal 11 is supplied to a signal identification unit 12 and a radio wave strength measurement unit 13. The signal identification unit 12 determines the reception signal type from a code attached to each frame in the reception signal. For example, the data of one frame may be made up of a header, a code, and data. An RF system is identified by the header. The type of the subsequent data is indicated by the code. In other words, the data is indicated to be data for pairing, or command data. The signal identification unit 12 is realized by a CPU, for example.

The radio wave strength measurement unit 13 measures the radio wave strength of a reception signal. The radio wave strength may also be measured by detecting the RF signal level received at a preceding RF processor. For example, in IEEE 802.15.4, there is specified a function that, in the case where a frame is received, calculates a link quality notification (LQI: Link Quality Indicator) from the noise in the signal itself and the interference strength, and issues a notification to above the physical layer. The LQI can be used as one example of radio wave strength.

If a reception signal is identified as data for pairing, the signal identification unit 12 extracts the radio wave strength of that data. Data for pairing is produced by the remote controller only in pairing mode. For example, data for pairing may be transmitted when a specific or arbitrary button or buttons of the remote controller is first pressed after purchase. Furthermore, pairing operations may be possible in a remote controller registration menu inside a settings menu of a television receiver. Data for pairing is continuously transmitted until pairing is completed.

The radio wave strength of the data for pairing that was first measured (initial measurement value) by the radio wave strength measurement unit 13 is retained in a retention unit 14. The retention unit 14 may be configured using memory such as RAM, for example. An arithmetic unit 15 uses an initial measurement value retained in the retention unit 14 and a later measurement value measured by the radio wave strength measurement unit 13 to calculate one of the relative distance of the remote controller and the relative movement amount. Since error is produced in the absolute distance and the absolute movement amount by being subjected to the influence of wireless module fluctuations and implementation fluctuations, etc., the later measurement value is converted into a relative value based on a distance obtained by the initial measurement value. Herein, in the description hereinafter, the relative distance and the relative movement amount are referred to as simply the distance and the movement amount. Furthermore, in the description hereinafter, an example of computing a distance and determining the computed distance is discussed, but a difference in distance can be similarly computed as the movement amount, and the movement amount can be similarly determined.

The arithmetic unit 15 conducts an arithmetic operation of substituting an actual measurement value into a relational expression between radio wave strength and distance or movement amount. In this case, relationships between radio wave strengths and distances or movement amounts may also be created in advance as a table, retained in ROM, and distances or movement amounts may be computed using the table. Furthermore, in the arithmetic unit 15, it is determined whether or not a distance or movement amount is a set value. The arithmetic unit 15 functions as an arithmetic determining unit.

Arithmetic results and determination results of the arithmetic unit 15 are supplied to a screen creation unit 16. The screen creation unit 16 creates a display screen. A created display screen is supplied to and displayed on a display unit 17 such as a liquid crystal display. In the case of a television receiver, a display screen for displaying television broadcast programs is used as the display unit 17. As one example, the screen creation unit 16 may store a plurality of display screen data in ROM, and supply a display screen corresponding to the determination results of the arithmetic unit 15 to the display unit 17. The arithmetic unit 15 is realized by a CPU, for example.

[Pairing Operations in the First Embodiment]

Pairing operations in the first embodiment will be described with reference to the flowchart in FIG. 3 and the drawings of display screens in FIG. 4. The first embodiment is an example wherein there is one type of motion instruction pattern for a remote controller held by the user. A motion instruction pattern means motion instructions that include a distance (relative distance) and a number of determinations. For example, the number of determinations may be two. The distance for the first determination is taken to be half the distance of the initial measurement position with respect to the television receiver. The distance for the second determination is taken to be twice the initial measurement value distance with respect to the television receiver.

Figure 3:
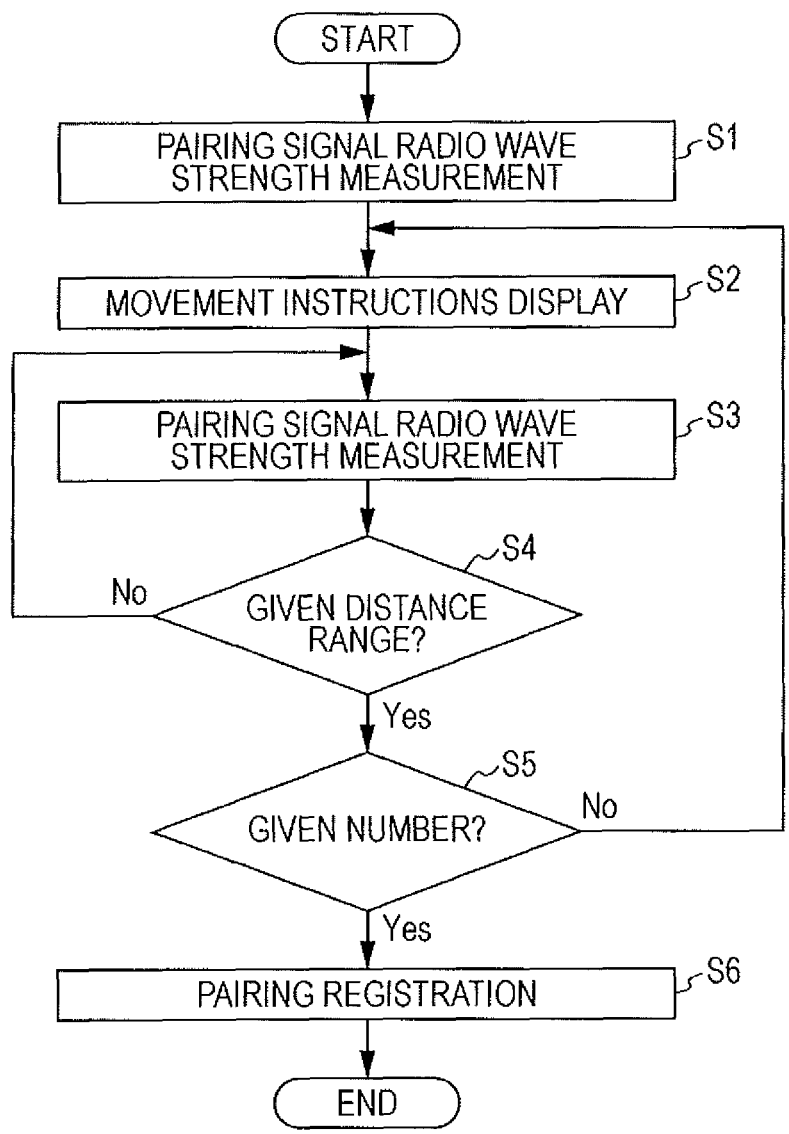
FIG. 3 is a flowchart illustrating a flow of a process in a first embodiment of the present invention.

In step S1 in FIG. 3, the radio wave strength of the pairing signal first received by the radio wave strength measurement unit 13 is measured. An initial measurement value is retained in the retention unit 14. In step S2, movement instructions are given by the display unit 17.

Figure 4:
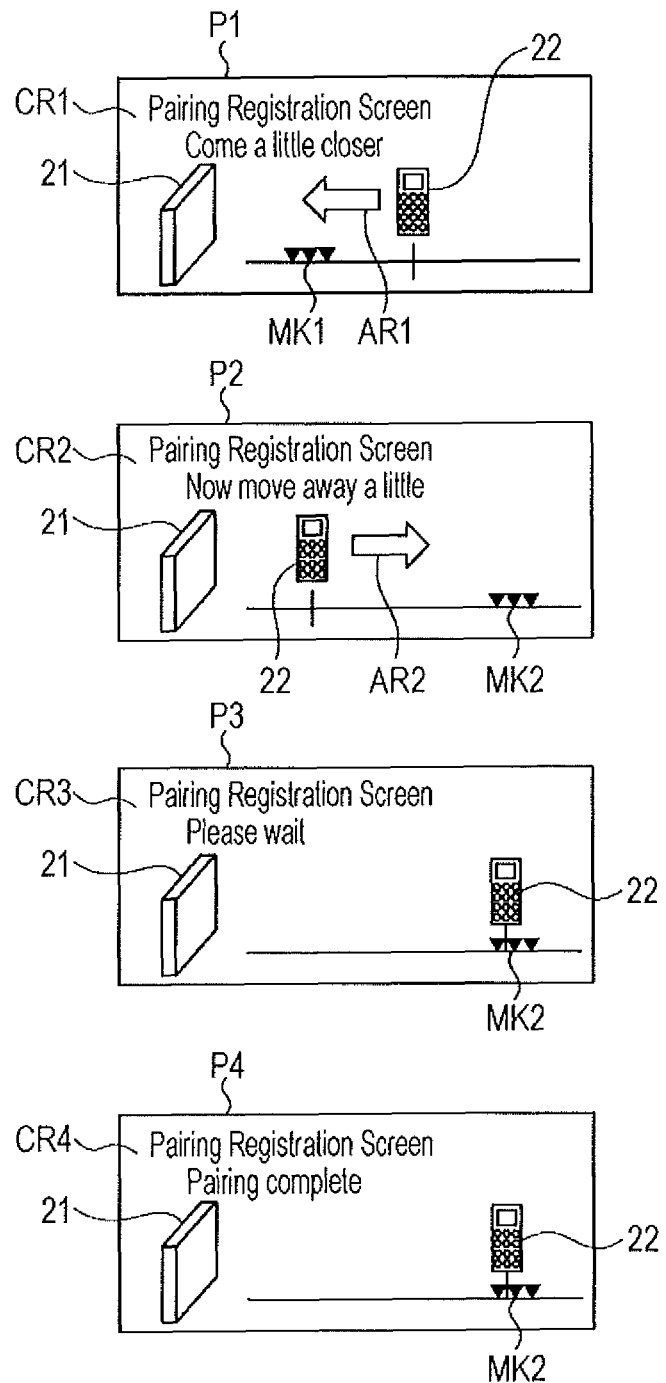
FIG. 4 is an outlined line drawing illustrating one example of display screens in a first embodiment of the present invention.

FIG. 4 illustrates examples of display screens generated by the screen creation unit 16 and displayed by the display unit 17. A display screen P1 is displayed in correspondence with first movement instructions issued in step S2. The display screen P1 includes a TV image 21 that schematically represents a television receiver, and an RC image 22 that schematically represents a remote controller. Additionally, there exist in the display screen a marker MK1 that represents the position of an instructed distance, an arrow AR1 that indicates the movement direction, and message text CR1. These elements are also included in other display screens.

The distance of the TV image 21 in the display screen P1 and other display screens is fixed. The initial measurement value measured by the radio wave strength measurement unit 13 is retained by the retention unit 14. For example, assume that the initial measurement value is the value "80". Herein, the numerical value of the measurement value expresses a relative radio wave strength for convenience in explanation. The arithmetic unit 15 computes an initial distance of the remote controller from the initial measurement value, and the RC image 22 is displayed at the position of the computed initial distance.

The distance to be instructed in the first determination is set to half the initial distance between the TV image 21 and the RC image 22. Assume that the radio wave strength at the instructed distance is 40. In practice, distance and radio wave strength do not exist in a linear relationship, but both are assumed to exist in a linear relationship for convenience in explanation. The display position of the marker MK1 in the display screen P1 indicates the position of the instructed distance. The direction in which to move from the current position to the position of the instructed distance is indicated by the arrow AR1. The message "Pairing Registration Screen—Come a little closer" is displayed as the text CR1.

The remote controller (held by the user) comes closer to the television receiver in accordance with the message of the text CR1. In step S3, the radio wave strength of the pairing signal is measured by the radio wave strength measurement unit 13. The measured radio wave strength increases in accordance with the remote controller coming closer. Herein, the RC image 22 may also be made to come closer to the TV image 21 on the display screen P1 in response to the user's movement.

In step S4 it is determined from the initial measurement value of the radio wave strength and the measured radio wave strength whether or not the position of the remote controller is within a given range with respect to the instructed distance. For example, it may be determined whether or not the measurement value exists within the range (0.5±0.1). Since the instructed distance during the first determination (the position of the marker MK1) is set to half the first distance, if the radio wave strength becomes approximately "40" (80×0.5), it is determined that the RC image 22 has reached the position of the instructed distance (the marker MK1), and the determination result in step S4 becomes positive.

In the case where the determination in step S4 is positive, in step S5 it is determined whether or not a number of determinations determined within a given range has reached a set number. The set number in step S5 is assumed to be set to 2. Since this is the first determination, the determination result in step S5 is negative, and the process returns to step S2 (movement instructions display).

Returning to step S2, a movement instructions display screen P2 is displayed by the display unit 17 for the second determination. As illustrated in FIG. 4, a distance twice the initial distance is set as the second distance, a marker MK2 is displayed at that position, and an arrow AR2 in the direction of moving away is displayed. The message "Pairing Registration Screen—Now move away a little" is displayed as text CR2.

The user moves away from the television receiver in accordance with the message while holding the remote controller. In step S3, the radio wave strength of the pairing signal is measured by the radio wave strength measurement unit 13. The measured radio wave strength decreases in accordance with the remote controller moving away. Herein, the RC image 22 may also be made to move on the display screen P2 in response to the user's movement.

In step S4 it is determined from the initial measurement value and the measured radio wave strength whether or not the distance of the remote controller is within a given range with respect to the instructed distance. In other words, it is determined whether or not the measured distance exists in the range (2±0.1). Since the instructed distance during the second determination is set to twice the first distance, if the radio wave strength becomes approximately "160" (80×2), it is determined that the RC image 22 has reached the position of the instructed distance (the marker MK2), and the determination result in step S4 becomes positive.

In the case where the determination in step S4 is positive, in step S5 it is determined whether or not a number of determinations determined within a given range has reached a set number. The set number in step S5 is assumed to be set to 2. Since this is the second determination, the determination result in step S5 is positive, and the process proceeds to step S6 (pairing registration).

Pairing registration is a process wherein communication is performed between a transmission module of a remote controller and a reception module of a television receiver, and wherein each other's IDs are registered as registry IDs. Since this process takes some time, a display screen P3 is displayed during pairing registration, as illustrated in FIG. 4. The TV image 21, the RC image 22, the marker MK2, and message text CR3 are included in the display screen P3. "Pairing Registration Screen—Please wait" is displayed as the message.

When a given amount of time elapses and pairing is completed, a display screen P4 is displayed. The TV image 21, the RC image 22, the marker MK2, and message text CR4 are included in the display screen P4. "Pairing Registration Screen—Pairing complete" is displayed as the message.

In the foregoing first embodiment of the present invention, pairing is conducted by issuing motion instructions by screen display on a television receiver, and moving a remote controller held by the user according to an instructed pattern. Consequently, a third party unable to view the display screens and conduct the instructed motion cannot conduct pairing. In this way, only specific users are able to conduct pairing comparatively easily.

[Modification of First Embodiment]

In the foregoing description, the motion instruction pattern was fixed to one type. In this case, there is a danger that a third party might know the instruction pattern and conduct pairing registration. Thus, a random number is used to vary the motion instruction pattern.

In other words, in the movement instructions display in step S2, a different distance indicated by a random number is instructed in each determination. Defining the initial distance as 1, a random number between 0.1 and 2.0 in increments of 0.1 is generated as the instructed distance. For example, during the first determination, if the random number is 1.3, the instructed distance is taken to be 1.3. During the second determination, if the random number is 0.8, the instructed distance is taken to be 0.8. Varying the instructed distance in this way means that the motion instruction (come closer, move away) will vary by the random number, and the danger of a third party conducting pairing registration can be reduced. Additionally, the number of determinations may also be varied by a random number.

<2. Second Embodiment>

[Schematic Configuration of Second Embodiment]

The second embodiment of the present invention uses a transmitting apparatus and a receiving apparatus included in a configuration similar to that of the first embodiment (see FIG. 1). The configuration for pairing also uses a configuration similar to that of the first embodiment (see FIG. 2). A pairing signal is identified by a signal identification unit 12 from a code attached to each frame. The radio wave strength of the pairing signal is measured by the radio wave strength measurement unit 13. The radio wave strength of data for pairing measured first during pairing operations (the initial measurement value) is retained by a retention unit 14. Distances or movement amounts between a television receiver and a remote controller are computed by an arithmetic unit 15. In the arithmetic unit 15, it is determined whether or not a distance or movement amount is a set value. Additionally, instruction screens to be displayed by a display unit 17 are generated by a screen creation unit 16.

[Pairing Operations in the Second Embodiment]

Pairing operations in the second embodiment will be described with reference to the flowchart in FIG. 5 and the drawings of display screens in FIG. 6. In the second embodiment, it is not determined whether or not a number of determinations has reached a set number, but it is determined whether or not a given key provided on the remote controller has been pressed.

Figure 5:
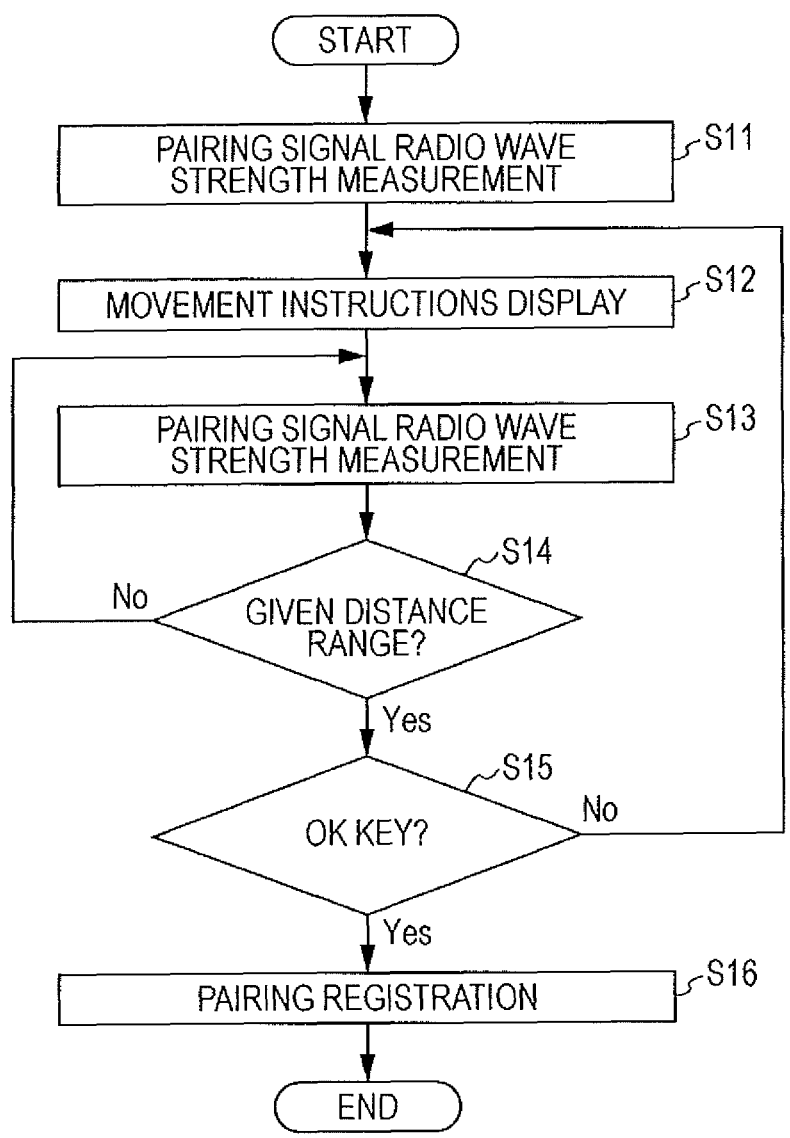
FIG. 5 is a flowchart illustrating a flow of a process in a second embodiment of the present invention.
Figure 6:
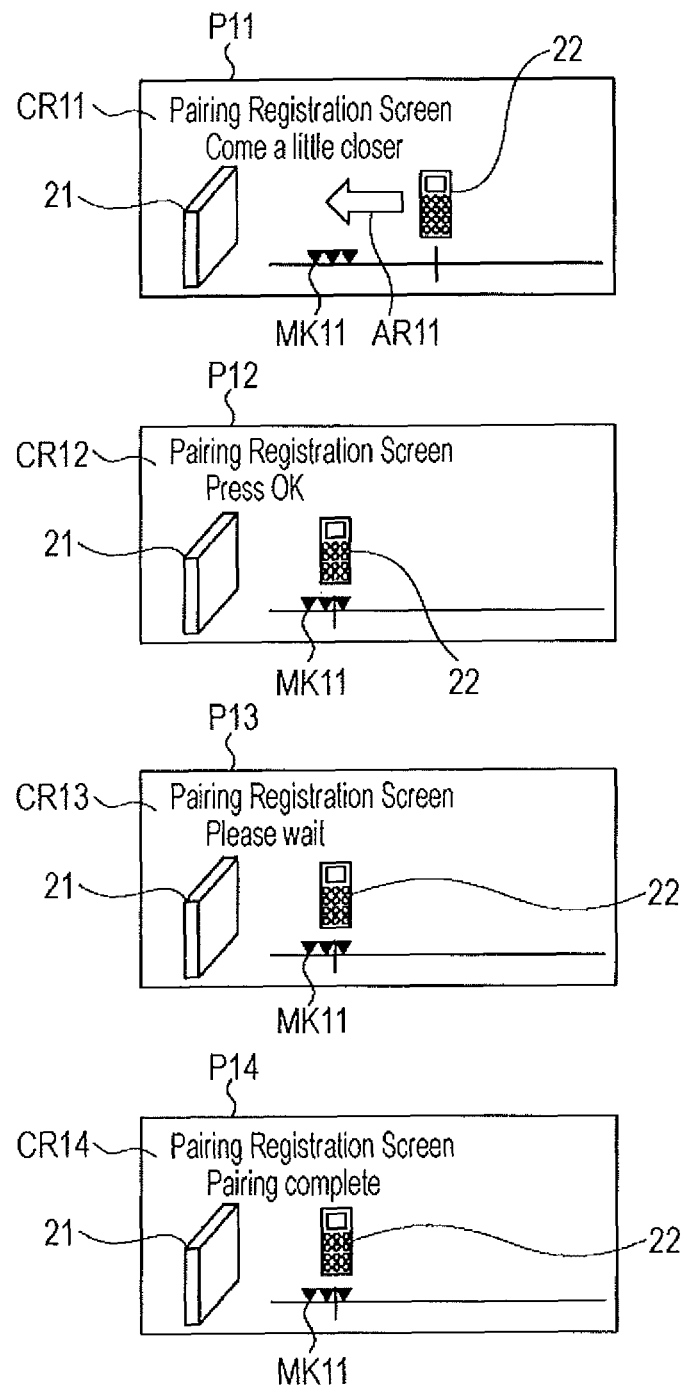
FIG. 6 is an outlined line drawing illustrating one example of display screens in a second embodiment of the present invention.

In step S11 in FIG. 5, the radio wave strength of the pairing signal received first is measured, and an initial measurement value is retained by the retention unit 14. For example, assume that the initial measurement value is the value "80". In step S12, movement instructions are displayed by the display unit 17. As illustrated in FIG. 6, a first display screen P11 is displayed. The arithmetic unit 15 computes the initial distance of the remote controller from the initial measurement value, and an RC image 22 is displayed at the position of the computed initial distance. The instructed distance during the first determination is set to half the initial distance between a TV image 21 and the RC image 22. The radio wave strength at the instructed distance becomes 40. The direction of movement from the current position to the position of the instructed distance is indicated by an arrow AR11. The message "Pairing Registration Screen—Come a little closer" is displayed as text CR11.

The remote controller comes closer to the television receiver in accordance with the message of the text CR11. In step S13, the radio wave strength of the pairing signal is measured by the radio wave strength measurement unit 13. In step S14, it is determined from the initial measurement value of the radio wave strength and the measured radio wave strength whether or not the position of the remote controller the measured value exists within the range (0.5±0.1). Since the instructed distance during the first determination (the position of the marker MK1) is set to half the first distance, if the radio wave strength becomes approximately "40" (80× 0.5), it is determined that the RC image 22 has reached the position of the instructed distance (the marker MK1), and the determination result in step S14 becomes positive.

In the case where the determination in step S14 is positive, in step S15 the display screen is changed and it is determined whether or not a given key, such as an OK key, for example, has been pressed. As illustrated in FIG. 6, the RC image 22 is positioned at the position of a distance half the initial distance (the marker MK11), and a display screen P12 is displayed in which text CR12 is displayed. The message "Pairing Registration Screen—Depress the OK key" is displayed as the text CR12.

In step S15, if it is determined from a reception signal that the OK key of the remote controller has been pressed, the determination result in step S15 becomes positive. If the determination result in step S15 becomes positive, the process proceeds to step S16 (pairing registration). During pairing registration, a display screen P13 is displayed, as illustrated in FIG. 6. "Pairing Registration Screen—Please wait" is displayed as a message on the display screen P13. When a given amount of time elapses and pairing is completed, a display screen P14 is displayed. "Pairing Registration Screen—Pairing complete" is displayed as a message on the display screen P14.

In the foregoing second embodiment of the present invention, pairing is conducted by issuing motion instructions and a type of key to press by screen display on a television receiver, moving a remote controller according to an instructed pattern, and depressing the specified key. Consequently, a third party unable to view the display screen, conduct the instructed motion, and press the instructed key cannot conduct pairing. In this way, only specific users are able to conduct pairing comparatively easily.

<3. Modifications>

The present invention is not limited to the foregoing embodiments, and various modifications based on the technical ideas of the present invention are possible. For example, the foregoing first and second embodiment may also be combined. In other words, both motion instructions and additional key operation instructions may be issued. Furthermore, a wireless protocol other than IEEE 802.15.4 may also be used as the wireless communication method.

The present invention may also be configured to detect the time change of radio wave strength in the case of issuing motion instructions, and conduct pairing registration only in the case where the motion predicted from the time change of the radio wave strength is approximately identical to the instructed motion. For example, motion instructions combining approaching motion and retreating motion may be issued, and it may be determined whether or not change in the radio wave strength corresponds to the instructed motion.

The present invention can also be applied to other wireless communication devices besides a television receiver and a remote controller. For example, the present invention can also be applied to wireless communication devices that transmit and receive audio data and/or video data by wireless communication (such as an audio playback apparatus and wireless headphones, or an audio playback apparatus and a portable digital music player, for example). The display apparatus is not limited to a liquid crystal display, and an indicator using one or more light-emitting diodes, a seven-segment display, etc., may also be used.

The invention claimed is:

1. A wireless communication apparatus comprising:
   displaying means for displaying a number of motion instructions;
   radio wave strength measuring means for measuring the radio wave strength of a signal from another wireless communication apparatus; and
   arithmetic determining means for computing one of a relative distance to the other wireless communication apparatus and a relative movement amount of the other wireless communication apparatus using the radio wave strength measured by the radio wave strength measuring means, and determining whether or not one of the relative distance and the relative movement amount approximately matches a respective one of the motion instructions;
   wherein the number of motion instructions is more than one such that a plurality of motion instructions are provided,
   wherein one of the relative distance and the relative movement amount are included in each motion instruction of the plurality of motion instructions, and
   wherein a pairing process with the other wireless communication apparatus is conducted in the case where it is determined by the arithmetic determining means that one of the relative distance and the relative movement amount approximately matches that for each said motion instruction of the plurality of motion instructions.

2. The wireless communication apparatus according to claim 1, wherein the radio wave strength first measured by the radio wave strength measuring means is retained as an initial measurement value, and a later measurement value is converted into a relative value based on the initial measurement value by the arithmetic determining means.

3. The wireless communication apparatus according to claim 1, wherein the one of the relative distance and the relative movement amount is changed for each said motion instruction.

4. The wireless communication apparatus according to claim 1, wherein one of the relative distance and the relative movement amount, and the presence or absence of a given key operation are included in each said motion instruction, and the pairing process is conducted if it is determined by the arithmetic determining means that one of the relative distance and the relative movement amount approximately matches that for each said motion instruction, and if it is detected that the given key was pressed.

5. The wireless communication apparatus according to claim 1, wherein the other wireless communication apparatus is a remote controller commander of a television receiver, and the displaying means is a display apparatus of the television receiver.

6. A wireless communication method comprising:

a step of displaying a number of motion instructions by a display unit; and an arithmetic determining step of computing one of a relative distance to another wireless communication apparatus and a relative movement amount of the other wireless communication apparatus using the radio wave strength measured by a radio wave strength measurement unit, and determining whether or not one of the relative distance and the relative movement amount approximately matches a respective one of the motion instructions;

wherein the number of motion instructions is more than one such that a plurality of motion instructions are provided, wherein one of the relative distance and the relative movement amount are included in each motion instruction of the plurality of motion instructions, and wherein a pairing process with the other wireless communication apparatus is conducted in the case where it is determined in the arithmetic determining step that one of the relative distance and the relative movement amount approximately matches that for each said motion instruction of the plurality of motion instructions.

7. A wireless communication apparatus comprising:

a display unit to display a number of motion instructions;

a radio wave strength measuring unit to measure a radio wave strength of a signal from another wireless communication apparatus; and an arithmetic determining unit to compute one of a relative distance to the other wireless communication apparatus and a relative movement amount of the other wireless communication apparatus using the radio wave strength measured by the radio wave strength measuring unit, and determine whether or not one of the relative distance and the relative movement amount approximately matches a respective one of the motion instructions;

wherein the number of motion instructions is more than one such that a plurality of motion instructions are provided, wherein one of the relative distance and the relative movement amount are included in each motion instruction of the plurality of motion instructions, and wherein a pairing process with the other wireless communication apparatus is conducted in the case where it is determined by the arithmetic determining unit that one of the relative distance and the relative movement amount approximately matches that for each said motion instruction of the plurality of motion instructions.

* * * * *